United States Patent [19]

Mitamura

[11] 4,349,777
[45] Sep. 14, 1982

[54] VARIABLE CURRENT SOURCE

[75] Inventor: Masakazu Mitamura, Gyoda, Japan

[73] Assignee: Takeda Riken Kogyo Kabushikikaisha, Tokyo, Japan

[21] Appl. No.: 204,929

[22] Filed: Nov. 7, 1980

[30] Foreign Application Priority Data

Nov. 19, 1979 [JP] Japan .................... 54-149655

[51] Int. Cl.³ .............. G01R 27/14; G05F 1/58; G05F 1/613
[52] U.S. Cl. ..................... 323/226; 307/358; 323/280; 323/281; 323/297; 324/62
[58] Field of Search ............ 307/98, 358, 297, 298; 323/281, 297, 354, 226, 233, 280; 324/62; 340/347 CC

[56] References Cited
PUBLICATIONS

Sahasrbudhe, "Building a Very High Stability Reference", Electronic Engineering, vol. 49, No. 593, Jun. 1977, p. 31.
Stewart, "Self Stabilizing Voltage Reference", RCA Technical Note No. 1220, Dec. 1978, pp. 1–4.
Mumaw, "Programmable Regulator Card", IBM TDB, vol. 20, No. 6, Nov. 1977, p. 2180.

Primary Examiner—A. D. Pellinen
Attorney, Agent, or Firm—Staas & Halsey

[57] ABSTRACT

A plurality of metal resistance elements and a metal resistance element for compensation use are formed on a common substrate and placed under the same temperature condition. A reference current is applied to the metal resistance element for compensation use to yield an auxiliary reference voltage. A plurality of switches are individually connected in series to the reference metal resistance elements and the auxiliary reference voltage is provided to the series circuits to selectively control the switches, thereby obtaining various currents.

6 Claims, 5 Drawing Figures

REFERENCE CURRENT GENERATING CKT

VARIABLE CURRENT SOURCE

BACKGROUND OF THE INVENTION

The present invention relates to a variable current source which is capable of generating selectively currents of different magnitudes and, in particular, currents which are stable in terms of temperature and high in accuracy.

Heretofore, there has been proposed what is called a digital multi-meter as a measuring instrument which measures, for example, a voltage or resistance value and displays the measured result in the form of a digital value. Such a meter is required to be able to selectively generate predetermined various values. In this case, in order to conduct such measurements with high accuracy, it is necessary that the current values be high in accuracy and insusceptible to ambient temperature variations, that is, stable in terms of temperature. A variable current source that has been proposed, for providing various currents which are highly accurate and stable in terms of temperature, employs a reference voltage source for generating a predetermined voltage regardless of ambient temperature variations and with high accuracy and reference resistors of highly accurate resistance values and which are free from the influence of temperature variations. In addition, use is made of reference resistors of different resistance values respectively corresponding to the values of currents to be generated. As the reference resistors, winding resistors are employed. The winding resistors which are stable in terms of temperature are expensive and, especially, winding resistors of large resistance values are costly and bulky.

SUMMARY OF THE INVENTION

It is an object of the present invention to provide a variable current source which employs only one resistor which is highly accurate and stable in terms of temperature but which is capable of selectively generating highly accurate and stable currents of various values.

Another object of the present invention is to provide a variable current source which is capable of selectively generating currents of various highly accurate and stable values in terms of temperature and which can be formed small in size and at low cost.

Yet another object of the present invention is to provide a variable current source which permits selective generation of currents of predetermined values without being affected by the ON resistance of a select switch.

According to the present invention, a plurality of metal resistance elements and a metal resistance element for compensation use are simultaneously formed of the same material on a common substrate so that they are disposed in adjacent but spaced relation, that is, placed under the same temperature condition. A predetermined reference current is generated from a reference current source in such a manner that it is not readily affected by temperature variations. The reference current is applied to the metal resistance element for compensation use to yield an auxiliary reference voltage. By a voltage-current converter one or more of the plurality of metal resistance elements are selected and the auxiliary reference voltage is converted to a current corresponding to the resistance value of the selected metal resistance element(s). With such an arrangement, the temperature characteristics of all the metal resistance elements on the substrate coincide very well and, in addition, since the auxiliary reference voltage obtained in the metal resistance elements is converted to a current corresponding to the resistance value of the selected metal resistance element(s), that is, since the current is obtained by dividing the auxiliary reference voltage by the resistance value of the selected metal resistance element(s), the temperature variation in the metal resistance element(s) is cancelled, thus providing a current unaffected by a temperature change. Moreover, the metal resistance elements can be made markedly small and inexpensive as compared with the winding resistors.

DETAILED DESCRIPTION OF THE PREFERRED EMBODIMENTS

Figure 1:
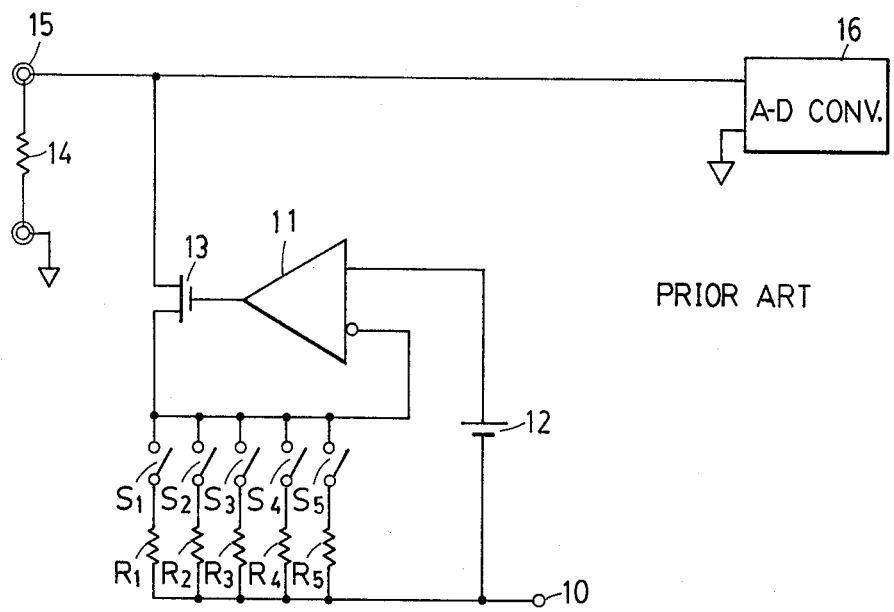
FIG. 1 is a connection diagram showing a conventional variable current source.

A conventional variable current source is such as shown in FIG. 1, in which one end of a reference voltage source 12 is connected with a non-inverted input side of an operational amplifier 11 and its inverted input side is connected to the other end of the reference voltage source 12 via switches $S_1$ to $S_5$ and resistors $R_1$ to $R_5$. The connection point between the resistors and the other end of the reference voltage source 12 is connected with a voltage terminal 10 which is supplied with a predetermined voltage. The output side of the operational amplifier 11 is connected with the gate of a field effect transistor (hereinafter referred to as FET) 13, which has its source connected with the inverted input side of the operational amplifier 11 and has its drain connected with a current output terminal 15. The current output terminal 15 is grounded, for example, via a resistor 14 under test and connected with the input side of an A-D converter 16. The voltage at the voltage terminal 10 is selected such that a voltage may be applied between the source and drain of the FET 13 to make it conduct. The resistance values of the resistors $R_1$ to $R_5$ are selected to be, for example, 1 KΩ, 10 KΩ, 100 KΩ, 1 MΩ and 10 MΩ, respectively, and a reference voltage $V_O$ of the reference voltage source 12 is selected to be 100 V. In this variable current source, for example, when the switch $S_1$ is turned ON, a voltage across the resistor $R_1$ connected to the switch $S_1$ becomes equal to the reference voltage $V_O$ of the reference voltage source 12 to flow a current, $V_O/R_1$, where $R_1$ is the resistance value of the resistor $R_1$. This current flows in the FET 13, and consequently it flows in the resistor 14 under test.

Assuming that the resistors $R_1$ to $R_5$ respectively have such resistance values as mentioned above, when the switches $S_1$ to $S_5$ are selectively turned ON one after another, currents flowing in the FET 13 are respectively 1 mA, 100 μA, 10 μA, 1 μA and 0.1 μA. In this way, reference currents of different values are generated.

If the variable current source is required to be highly stable so that the values of the currents thus produced may not readily be affected by temperature; namely, variations in the currents must be smaller than 10 ppm/°C. (0.01%/10° C.), then it is necessary that the resistors $R_1$ to $R_5$ be correspondingly stable relative to temperature variations. As such highly stable and accurate resistors, use has been made of winding resistors; consequently, the prior art has the defect that resistors having such large resistance values as 1 MΩ and 10 MΩ, in particular, are expensive and bulky.

Figure 2:
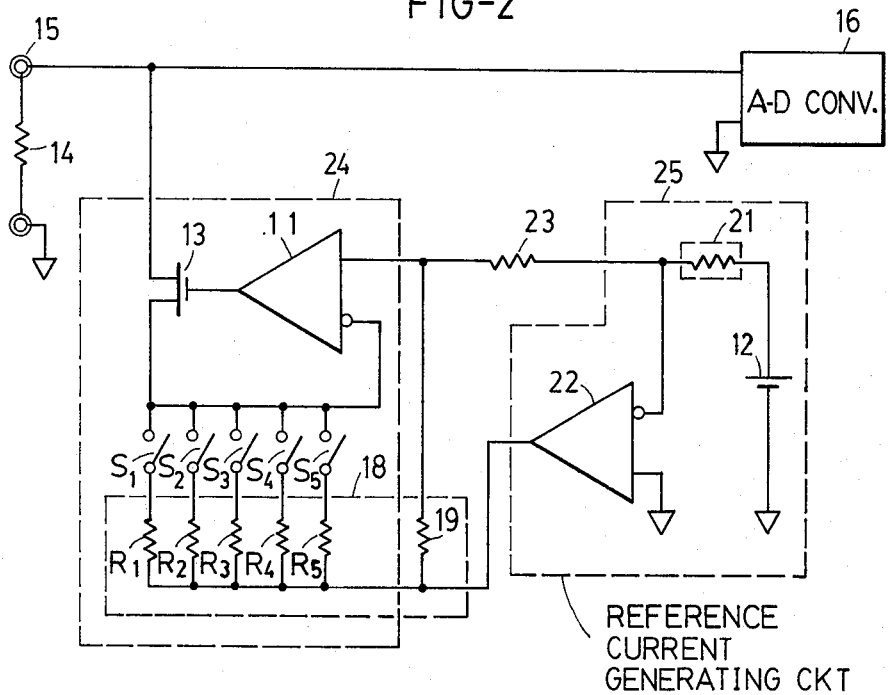
FIG. 2 is a connection diagram illustrating an embodiment of a variable current source of the present invention.

FIG. 2 illustrates an embodiment of the variable current source of the present invention. In the present invention, reference resistance elements $R_1$ to $R_5$ are formed on a common insulating substrate 18 of ceramic or glass, on which a resistance element 19 for compensating use is also formed of the same material as the reference resistance elements $R_1$ to $R_5$. These resistance elements are obtained in the following manner: A metal thin film is formed as by vacuum evaporation on the insulating substrate 18 and selectively etched away by chemical etching techniques to form desired patterns, thus obtaining metal thin film resistance elements. The resistance value of each resistance element is dependent on the material and the thickness of the evaporated film and the geometrical configuration of the resistance element. Accordingly, the relative resistance values of the reference resistance elements, that is, the resistance value ratio, for instance, between the reference resistance elements $R_1$ and $R_2$ can be made 1:10 relatively easily and with high accuracy. The resistance elements $R_1$ to $R_5$ and 19 are disposed adjacent one another and placed under the same temperature condition.

A reference current is generated, using the reference voltage $V_O$ of the reference voltage source 12 and the resistance value $R_O$ of a reference resistance element 21 whose resistance value is not readily affected by temperature, and the reference current is supplied to the compensating resistance element 19 to yield an auxiliary reference voltage. For instance, an operational amplifier 22 is provided, the inverted input side of which is connected with one end of the reference voltage source 12 of the voltage $V_O$ via the reference resistance element 21 of the resistance value $R_O$ and the non-inverted input side of which is connected with a common potential point, and the other end of the reference voltage source 12 is also connected with the common potential point, thus making up a reference current generator 25. The inverted input side of the operational amplifier 22 is connected with the output side of the operational amplifier 22 via a resistor 23 and the compensating resistance element 19. By the action of the operational amplifier 22 its two input sides become equipotential, and in this embodiment their potentials become equal to the potential of the common potential point, so that a current $I_O$ flowing in the reference resistance element 21 becomes $V_O/R_O$. The operational amplifiers 11 and 22 are high input impedances and the reference current $I_O$ flowing in the resistance element 21 is provided via the resistor 23 to the compensating resistance element 19. The voltage $V_O$ of the reference voltage source 12 and the resistance value $R_O$ of the reference resistance element 21 are both stable and highly accurate, and the reference current $I_O$ is highly accurate and constant regardless of temperature variations. Accordingly, letting the resistance value of the compensating resistance element 19 be represented by $R_S$, an auxiliary reference voltage, $R_S I_O$, is produced across the compensating resistance element 19.

When selecting one or more of the resistance elements $R_1$ to $R_5$ on the substrate 18, the auxiliary reference voltage is converted by a voltage-current converter 24 to a current corresponding to the selection. That is, the connection point between the compensating resistance element 19 and the resistor 23 is connected with the non-inverted input side of the operational amplifier 11, the inverted input side of which is connected to one end of each of the switches $S_1$ to $S_5$. The other ends of the switches $S_1$ to $S_5$ are connected with the connection point of the compensating resistance element 19 and the operational amplifier 22 via the resistance elements $R_1$ to $R_5$, respectively. The output of the operational amplifier 11 is connected with the gate of the junction FET 13, which has its source connected with the inverted input side of the operational amplifier 11 and has its drain connected with a current output terminal 15.

The above arrangement is the same as that in the case where the auxiliary reference voltage across the compensating resistance element 19 is used instead of the voltage of the reference voltage source 12 in FIG. 1. Accordingly, when turning ON selectively one or more of the switches $S_1$ to $S_5$, a current corresponding to the resistance value of the resistance element connected with the switch turned ON flows in the FET 13. For example, in the case of measuring a resistance value, the current of the FET 13 is provided to the resistor 14 under test and the voltage across the resistor 14 is converted by an A-D converter 16 to a digital value for display as the resistance value measured.

With the above arrangement, currents of various values can be yielded by selective control of the switches $S_1$ to $S_5$. The resistance elements $R_1$ to $R_5$ and the compensating resistance element 19 are formed simultaneously on the same substrate and, for example, in the case where they are formed of tantalum nitride, their temperature coefficients are relatively large, about 100 ppm/°C., which is larger than the temperature coefficient of the current value desired to obtain. Since the resistance elements on the substrate 18 have exactly the same temperature coefficient, however, the resistance value ratios among these resistance elements do not change even if temperature varies. Letting $R_1$ to $R_5$ stand for the resistance values of the resistance elements $R_1$ to $R_5$ relative to a reference temperature, $R_S$ stand for the resistance value of the compensating resistance element 19 and $\Delta$ stand for their variation ratio based on the temperature variation, the resistance value of the compensating resistance element 19 is $R_S(1+\Delta)$ and the resistance value of the resistance element $R_1$ is $R_1(1+\Delta)$. The auxiliary reference voltage induced in the compensating resistance element 19 is $R_S(1+\Delta)I_O$, as mentioned previously, and a current which flows in the resistance element $R_1$ when only the switch $S_1$ is turned ON, is as follows:

$$\frac{R_S(1+\Delta)I_O}{R_1(1+\Delta)} = \frac{R_S I_O}{R_1}$$

and this current assumes a value independent of the temperature change.

In this way, in the voltage-current converter 24 a current independent of the temperature change can be obtained corresponding to the resistance element selected. Since the auxiliary reference voltage which is the reference voltage for the above purpose is generated by the reference voltage source 12 and the reference resistance element 21, it is sufficient only to employ stable elements as the reference voltage source 12 and the reference resistance element 21; in other words, it suffices that only one resistance element, that is, the reference resistance element 21 alone is highly accurate and stable in terms of temperature. In the case of forming metal thin film resistance elements on the common substrate 18, their relative resistance values are determined by their geometrical configurations, as referred to previously, so that the relative resistance value, namely, the resistance value ratio can easily be obtained accurately. Moreover, it is also possible to easily obtain desired resistance values by trimming the resistance patterns on the substrate 18, as required, in the same manner as in this kind of field; accordingly, highly accurate resistance values are available. In addition, the metal thin film resistors can be formed small on the common substrate 18. As compared with the case of the prior art arrangement in which the resistance elements $R_1$ to $R_5$ are all constituted by highly accurate resistors, the variable current source of the present invention can be reduced markedly in cost and in size. For example, the resistance elements $R_1$ to $R_5$ of the resistance values 1 KΩ, 10 KΩ, 100 KΩ, 1 MΩ and 10 KΩ and the compensating resistance element 19 of 100Ω, as mentioned previously, can be formed on a 5×5 mm² substrate 18.

Figure 3:
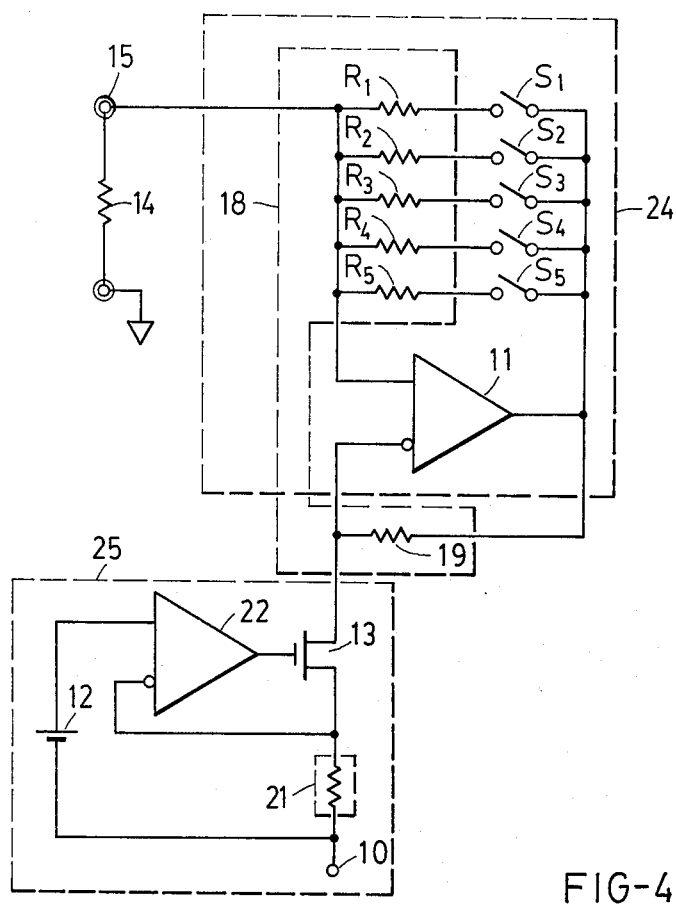
FIGS. 3 and 4 are connection diagrams illustrating other embodiments of the variable current source of the present invention.

As illustrated in FIG. 3, in the reference current generator 25 the positive and negative sides of the reference voltage source 12 are respectively connected with the non-inverted input side of the operational amplifier 22 and the negative power source terminal 10; the output side of the operational amplifier 22 is connected with the gate of the FET 13; the inverted input side of the operational amplifier 22 is connected via the reference resistance element 21 to the power source terminal 10; the drain of the FET 13 is connected with one end of the compensating resistance element 19 and the inverted input side of the operational amplifier 11; and the source of the FET 13 is connected with the resistance element 21 and the inverted input side of the operational amplifier 22. Between the non-inverted input side and the output side of the operational amplifier 11 are connected series circuits of the resistance elements $R_1$ to $R_5$ and the switches $S_1$ to $S_5$. The common connection point of the resistance elements $R_1$ to $R_5$ is connected with the current output terminal 15. The output side of the operational amplifier 11 is connected with the other end of the compensating resistance element 19.

With such an arrangement, too, the reference current generator 25 operates so that both input potentials of the operational amplifier 22 may become equal to each other, the voltage across the reference resistance element 21 becomes equal to the reference voltage $V_O$ of the reference power source 12, and the reference current $I_O$, which is dependent on the reference voltage $V_O$ and the reference resistance value $R_O$ of the reference resistance element 21, flows in the FET 13 and thence to the compensating resistance element 19 to induce therein the auxiliary reference voltage $V_S$. The auxiliary reference voltage $V_S$ is applied across the resistance element connected to that one of the switches $S_1$ and $S_5$ which is turned ON, flowing in the resistance element a current determined by dividing the auxiliary reference voltage $V_S$ by its resistance value. By the voltage at the terminal 10 an operating current is provided to the drain and source of the FET 13.

Figure 4:
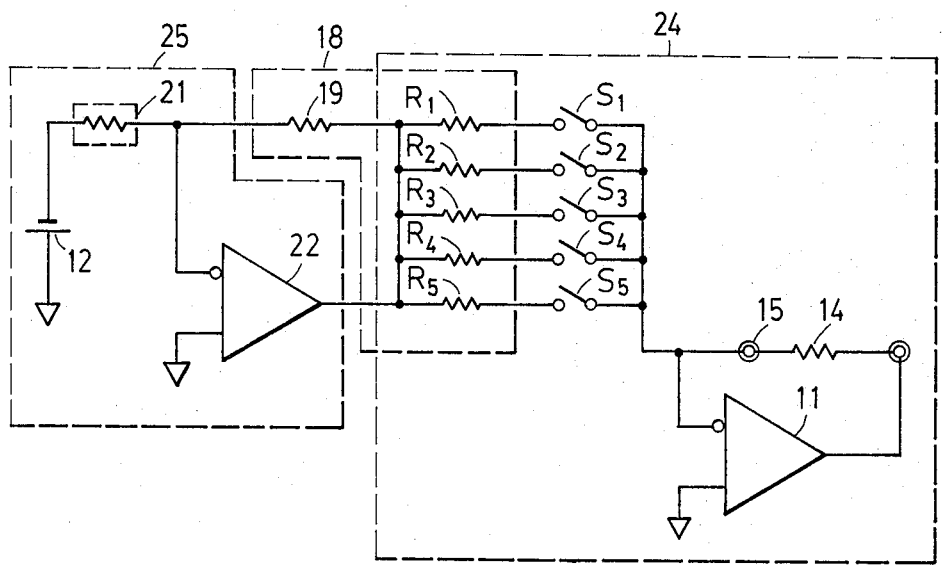
Figure 5:
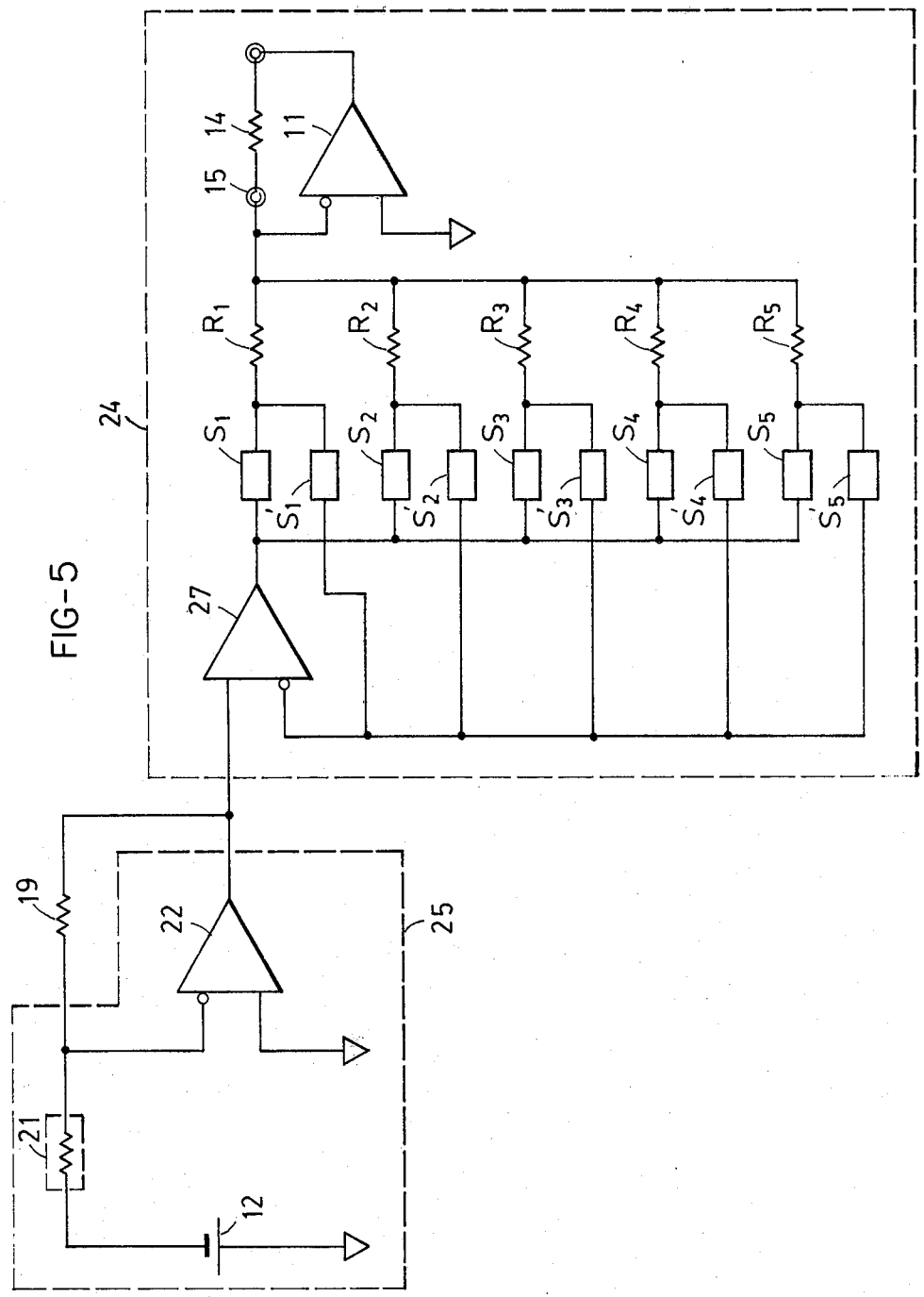
FIG. 5 is a connection diagram illustrating another embodiment of the variable current source of the present invention which is adapted so that the influence of an ON resistance of a switch is removed.

FIG. 4 illustrates a modified form of the variable current source of the present invention, in which the positive side of the reference power source 12 is grounded; its negative side is connected via the reference resistance element 21 to the inverted input side of the operational amplifier 22; the non-inverted input side of the operational amplifier 22 is grounded; its output side is connected to its inverted input side via the compensating resistance element 19; the output side of the operational amplifier 22 is also connected with the common connection point of the resistance elements $R_1$ to $R_5$; the common connection point of the switches $S_1$ to $S_5$ is connected with the inverted input side of the operational amplifier 11; the non-inverted input side of the operational amplifier 11 is grounded; and the resistance element 14 under test is connected between the output side and the inverted input side of the operational amplifier 11. It will readily be understood that, also in this case, the reference current, $I_O = V_O/R_O$, flows in the compensating resistance element 19, making it possible to generate at the output terminal 15 currents of various values which are not readily affected by temperature. In the foregoing it is described that when the switches $S_1$ to $S_5$ are turned ON, their ON resistances are zero. As such switches $S_1$ to $S_5$, use can be made of, for example, lead relays whose ON resistances are negligibly small. In the case where the ON resistances are not negligible, it is possible to employ an arrangement such, for example, as shown in FIG. 5. In FIG. 5 parts corresponding to those in FIG. 4 are identified by the same reference numerals. The output side of the operational amplifier 22 is connected to the non-inverted input side of an operational amplifier 27, the output side of which is connected with the common connection point of the switches $S_1$ to $S_5$. The connection points between the switches $S_1$ to $S_5$ and the resistance elements $R_1$ to $R_5$ are connected to the inverted input side of the operational amplifier 27 via switches $S_1'$ to $S_5'$, respectively. The common connection point of the resistance elements $R_1$ to $R_5$ is connected with the current output terminal 15. As the switches $S_1$ to $S_5$ and $S_1'$ to $S_5'$, use can be made of switches formed by CMOS transistors, for example, CD4016 Bilateral Switch by RCA or National Semiconductor Inc. The switches $S_1$ and $S_1'$, $S_2$ and $S_2'$, ... $S_5$ and $S_5'$ are turned ON simultaneously. As described previously, the potential at the non-inverted input side of the operational amplifier 27 becomes equal to the auxiliary reference potential $V_S$ obtained in the auxiliary resistance element 19 (the further resistance element for compensation). For instance, when the switches $S_1$ and $S_1'$ are turned ON, the input impedance of the operational amplifier 27 is sufficiently high and, by its feedback action, the potential at the inverted input side of the operational amplifier 27 also becomes equal to the auxiliary reference potential $V_S$ and no current flows in the switch $S_1'$, so that the potential at the connection point of the switch $S_1$ and the voltage across the resistance element $R_1$ becomes equal to the auxiliary reference voltage $V_S$ and even if the switch $S_1$ has an ON resistance, a current $V_S/R_1$ flows in the resistance element $R_1$.

The number of the resistance elements $R_1$ to $R_5$ is not limited specifically to five and their resistance values need not always be different but some of them may be the same. Also it is possible to turn ON two or more of the switches $S_1$ to $S_5$ at the same time.

It will be apparent that many modifications and variations may be effected without departing from the scope of the novel concepts of this invention.

What is claimed is:

1. A variable current source for providing a selected output current that is highly temperature stabilized to a current output terminal to which a selected load is connected, said variable current source comprising:
    a reference current generator for generating a reference current of a constant value that is substantially insusceptible to the influence of temperature;
    a plurality of reference resistance elements and a further resistance element for compensation use which are simultaneously formed on a common substrate so as to experience a common temperature;
    an auxiliary reference voltage generator wherein the output of the reference current generator is connected with a first terminal of said further metal resistance element to generate an auxiliary reference voltage across said further resistance element;
    a plurality of switches respectively connected in series with the plurality of reference resistance elements to form a respective plurality of series circuits; and
    a voltage-to-current converter which is connected to the series circuits and which, when one or more of said switches are turned ON, converts the auxiliary reference voltage to a current corresponding to the resistance value of the respective reference resistance element(s) connected to each of the switches turned ON,
    wherein said selected output current that is output from said current output terminal of said variable current source has said highly tremperature stabilized output current for any combination of said switches being ON.

2. The variable current source of claim 1, wherein the reference current generator comprises
    a first operational amplifier having an output and inverted and non-inverted inputs, and
    a series connection of a highly accurate reference resistor substantially insusceptible to the influence of temperature and a reference voltage source substantially insusceptible to the influence of temperature, the series connection of the reference resistor and the reference voltage source being connected between both said inputs of the first operational amplifier,
    wherein the reference current generator generates a reference current dependent on the resistance value of the reference resistor and the reference voltage.

3. The variable current source of claim 2, said auxiliary reference voltage generator comprising an auxiliary resistor having first and second terminals, said first terminal being connected to one terminal of said reference resistor and to the non-inverting input of said first operational amplifier, and said second terminal of said auxiliary resistor being connected to said further resistance element, and
    said voltage-to-current converter comprising a second operational amplifier having an output, an inverted input and a non-inverted input, and a field effect transistor having a source, a drain and a gate,
    wherein the auxiliary reference voltage generator is constituted by connecting the connection point of the reference resistor with the inverted input of the first operational amplifier via the auxiliary resistor to one end of the further resistance element and connecting the other end of the further resistance element to the output of the first operational amplifier, and further
    wherein the voltage-to-current converter is constituted by connecting the connection point of the auxiliary resistor and the further resistance element for compensation use to the non-inverted input of the second operational amplifier, by connecting the output side of the second operational amplifier to the gate of the field effect transistor, by connecting the drain and source of the field effect transistor to said current output terminal and to the inverted input of the second operational amplifier, respectively, and by connecting said series circuits of the reference resistance elements and the switches between the output of the first operational amplifier and the inverted input of the second operational amplifier.

4. The variable current source of claim 2, said voltage-to-current converter comprising a second operational amplifier having an output, an inverted input and a non-inverted input,
    wherein the auxiliary reference voltage generator is constituted by connecting the further resistance element for compensation use between the inverted input and the output of the first operational amplifier, and
    wherein the voltage-to-current converter is constituted by connecting one end of each of said series circuits of the reference resistance elements and the switches to the output side of the first operational amplifier, by connecting the other ends of said series circuits to said current output terminal and to the inverted input side of the second operational amplifier, and further
    wherein said load is connected between the output of the second operational amplifier and said current output terminal, and said non-inverted input of the first and second operational amplifiers is connected to a common potential.

5. The variable current source of claim 2, said voltage-to-current converter comprising
    a second operational amplifier having an output, an inverted input and a non-inverted input,
    said switches of said series circuits being connected to the output of the second operational amplifier, and
    a third operational amplifier having an output, an inverted input and a non-inverted input, and a plurality of other switches, each of said other switches corresponding to one of said switches of said series circuits, said other switches being turned ON in accordance with the turning ON of said switches of said series circuits,
    wherein the auxiliary reference voltage generator is constituted by connecting the further resistance element between the inverted input and the output of the first operational amplifier, by connecting the connection point of the output side of the first operational amplifier and the further resistance element to the non-inverted input of the second operational amplifier, by connecting the output of the second operational amplifier to one end of each of the series circuits of the reference resistance elements and the switches, by connecting te respective connection points of the reference resistance elements and the switches of said series circuits to the inverted input of the second operational amplifier via respective ones of said other switches, and by connecting the other end of each of said series circuits to the current output terminal and the inverted input of the third operational amplifier, and further wherein said load is connected between the output of the third operational amplifier and the current output terminal, and the non-inverted inputs of the first and the third operational amplifiers are connected to each other.

6. The variable current source of claim 1, said reference current generator comprising
- a power source terminal for connection to an external power source supplying a predetermined potential,
- a reference voltage source generating a constant reference voltage substantially insusceptible to the influence of temperature connected at one terminal to said power source terminal,
- a highly accurate reference resistor substantially insusceptible to the influence of temperature also connected at one terminal to said power source terminal,
- a field effect transistor having a gate, a drain and a source, and
- a first operational amplifier having an output, an inverted input, and a non-inverted input, and said voltage-to-current converter comprising a second operational amplifier having an output, an inverted input and a non-inverted input, wherein the non-inverted input of the first operational amplifier is connected to the power source terminal via the reference voltage source, and the inverted input of the first operational amplifier is connected to the other terminal of the voltage source via the highly accurate reference resistor, wherein the auxiliary reference voltage generator is constituted by connecting the output of the first operational amplifier to the gate of the field effect transistor, connecting the source and the drain of the field effect transistor to the inverted input of the first operational amplifier, and by connecting the drain of the field effect transistor to one end of the further resistance element, and wherein the voltage-to-current converter is constituted by connecting the further resistance element between the inverted input and the output of the second operational amplifier, by connecting said series circuits between the output and the non-inverted input of the second operational amplifier, and by connecting said current output terminal to the non-inverted input of the second operational amplifier.

* * * * *

UNITED STATES PATENT AND TRADEMARK OFFICE
CERTIFICATE OF CORRECTION

PATENT NO. : 4,349,777

DATED : 14 September 1982

INVENTOR(S) : Masakazu Mitamura

It is certified that error appears in the above-identified patent and that said Letters Patent is hereby corrected as shown below:

Column 7, line 19, delete "metal".

Signed and Sealed this

First Day of March 1983

[SEAL]

Attest:

GERALD J. MOSSINGHOFF

*Attesting Officer*     *Commissioner of Patents and Trademarks*